United States Patent
Wei et al.

(10) Patent No.: US 7,381,624 B2
(45) Date of Patent: Jun. 3, 2008

(54) TECHNIQUE FOR FORMING A SUBSTRATE HAVING CRYSTALLINE SEMICONDUCTOR REGIONS OF DIFFERENT CHARACTERISTICS LOCATED ABOVE A CRYSTALLINE BULK SUBSTRATE

(75) Inventors: Andy Wei, Dresden (DE); Thorsten Kammler, Ottendorf-Okrilla (DE); Michael Raab, Radebeul (DE); Manfred Horstmann, Duerrrhoehrsdorf-Dittersbach (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/177,214

(22) Filed: Jul. 8, 2005

(65) Prior Publication Data

US 2006/0113629 A1 Jun. 1, 2006

(30) Foreign Application Priority Data

Nov. 30, 2004 (DE) ....................... 10 2004 057 764

(51) Int. Cl.
*H01L 21/20* (2006.01)
(52) U.S. Cl. ............... 438/406; 438/458; 257/E21.567; 257/E21.568
(58) Field of Classification Search ............... 438/406, 438/407, 458; 257/255, E21.567, E21.568
See application file for complete search history.

(56) References Cited

U.S. PATENT DOCUMENTS

| | | | |
|---|---|---|---|
| 4,933,298 A | 6/1990 | Hasegawa | 437/62 |
| 5,371,401 A | 12/1994 | Kurita | 257/524 |
| 5,384,473 A | 1/1995 | Yoshikawa et al. | 257/255 |
| 5,882,987 A * | 3/1999 | Srikrishnan | 438/458 |
| 6,222,951 B1* | 4/2001 | Huang | 385/14 |
| 6,339,232 B1 | 1/2002 | Takagi | 257/192 |
| 6,468,880 B1 | 10/2002 | Lim et al. | 438/459 |
| 6,750,486 B2 | 6/2004 | Sugawara et al. | 257/265 |
| 6,770,507 B2* | 8/2004 | Abe et al. | 438/64 |
| 6,815,278 B1* | 11/2004 | Ieong et al. | 438/198 |
| 6,911,379 B2* | 6/2005 | Yeo et al. | 438/480 |
| 7,074,623 B2* | 7/2006 | Lochtefeld et al. | 438/3 |
| 2002/0019105 A1 | 2/2002 | Hattori et al. | 438/311 |
| 2003/0047782 A1 | 3/2003 | Hasegawa et al. | 257/347 |
| 2004/0075141 A1 | 4/2004 | Maeda et al. | 257/347 |
| 2005/0045995 A1* | 3/2005 | Ieong et al. | 257/627 |
| 2005/0116290 A1* | 6/2005 | de Souza et al. | 257/347 |
| 2005/0145940 A1* | 7/2005 | Maeda et al. | 257/347 |

FOREIGN PATENT DOCUMENTS

| | | |
|---|---|---|
| EP | 1 193 754 | 4/2002 |
| JP | 01162362 | 6/1989 |
| WO | 2004/114400 | 12/2004 |

OTHER PUBLICATIONS

Yang et al., "High Performance CMOS Fabricated on Hybrid Substrate With Different Crystal Orientations," IEDM 03-453, 18.7.1-18.7.4,(2003).

* cited by examiner

*Primary Examiner*—Fernando L Toledo
(74) *Attorney, Agent, or Firm*—Williams, Morgan & Amerson, P.C.

(57) ABSTRACT

By direct bonding of two crystalline semiconductor layers of different crystallographic orientation and/or material composition and/or internal strain, bulk-like hybrid substrates may be formed, thereby providing the potential for forming semiconductor devices in accordance with a single transistor architecture on the hybrid substrate.

13 Claims, 5 Drawing Sheets

TECHNIQUE FOR FORMING A SUBSTRATE HAVING CRYSTALLINE SEMICONDUCTOR REGIONS OF DIFFERENT CHARACTERISTICS LOCATED ABOVE A CRYSTALLINE BULK SUBSTRATE

BACKGROUND OF THE INVENTION

1. Field of the Invention

Generally, the present invention relates to the formation of integrated circuits, and, more particularly, to the formation of crystalline semiconductor regions of different characteristics, such as different charge carrier mobilities in channel regions of a field effect transistor, on a single substrate.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, MOS technology is currently the most promising approach due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance device performance of the transistor elements by increasing the charge carrier mobility in the channel region for a given channel length, thereby offering the potential for achieving a performance improvement that is comparable with the advance to a future technology node while avoiding many of the above process adaptations associated with device scaling. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby presently making a reduction of the dopant concentration a less attractive approach unless other mechanisms are developed to adjust a desired threshold voltage. Second, the lattice structure, typically a (100) surface orientation, in the channel region may be modified, for instance by creating tensile or compressive stress to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 120% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials and manufacturing techniques.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Thus, in other approaches, external stress, created by, for instance, overlaying layers, spacer elements and the like, is used in an attempt to create a desired strain within the channel region. However, the process of creating the strain in the channel region by applying a specified external stress suffers from a highly inefficient translation of the external stress into strain in the channel region, since the channel region is strongly bonded to the buried insulating layer in silicon-on-insulator (SOI) devices or the remaining bulk silicon in bulk devices. Hence, although providing significant advantages over the above-discussed approach requiring additional stress layers within the channel region, the moderately low strain obtained renders the latter approach less attractive.

Recently, it has been proposed to provide so-called hybrid orientation substrates that include silicon regions of two different orientations, that is, a (100) surface orientation and a (110) surface orientation, due to the well-known fact that the hole mobility in (110) silicon along the <110> direction is maximal and is approximately 2.5 times the mobility in (100) silicon. Thus, by providing a (110) channel region for P-channel transistors in CMOS circuits, while maintaining the (100) orientation providing a superior electron mobility in the channel regions of the N-channel transistors, the performance of circuits containing both types of transistors may significantly be enhanced for any given transistor architecture, as for instance the electron mobility is maximal in a (100) plane along a <110> direction.

FIG. 1 schematically shows a cross-sectional view of a typical conventional hybrid orientation substrate that may be used for the formation of transistor elements in and on silicon regions having different orientations. In FIG. 1, a substrate 100 comprises a base substrate 101, which is comprised of crystalline silicon having a specified crystallographic orientation such as a (110) orientation. Formed in the base substrate 101 is a shallow trench isolation structure 102 comprised of insulating materials, such as silicon dioxide, silicon nitride and the like. Thus, the trench isolation structure 102 defines a crystalline region 106 having the (110) orientation and having a configuration as is typical for a silicon bulk substrate. Separated by the trench isolation structure 102 from the region 106 is a region 105 including a crystalline silicon region 103 having a different orientation, such as a (100) orientation, wherein the region 103 is bounded in the depth direction by a buried oxide layer 104. Consequently, the region 105 represents a typical SOI configuration.

The substrate 100 may be formed by well-established wafer bond techniques to form a substrate having the buried oxide layer 104 and the silicon layer 103 formed above the (110) substrate 101. Thereafter, advanced etch techniques are used to form an opening through the silicon layer 103 and the buried oxide layer 104 to expose a portion of the base substrate 101. Next, well-established selective epitaxial growth methods are employed to form a (110) silicon in the opening. After planarizing the resulting structure and forming the shallow trench isolations 102 by well-established techniques to obtain the substrate 100, transistor elements may be formed in and on the regions 106, 105 in conformity with device requirements.

Although the conventional substrate 100 provides significant advantages with respect to device performance, since, for example, P-channel transistors may be formed preferably in and on the region 106, while N-channel transistors may preferably be formed in and on the region 105, significant efforts are required to adapt and/or develop process and metrology techniques that simultaneously meet the requirements for SOI devices and bulk devices. For instance, any measurement procedures during the manufacturing process require different strategies for SOI devices, formed on the region 105, compared to bulk devices, formed on the region 106, thereby requiring a great deal of effort and production time to produce the required measurement results. In addition, process steps such as etching and rapid thermal annealing, which are used during the fabrication of transistor elements, are quite sensitive to substrate properties thereby also requiring significant efforts in adapting existing techniques and developing new process recipes when processing the hybrid substrate, thereby contributing to the overall process complexity.

In view of the above-described situation, there exists a need for an improved technique that enables providing semiconductor regions of different characteristics, such as different orientations, while eliminating or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of semiconductor substrates having semiconductor regions which differ in at least one of crystallographic orientation, inherent strain and type of semiconductor material. In particular embodiments, the present invention is directed to a technique that enables the formation of silicon-based bulk-like substrates having formed thereon crystalline regions with different crystallographic orientations. Consequently, semiconductor devices formed on such substrates may exhibit superior performance characteristics, while a common transistor architecture for bulk substrate devices may be used for all transistor devices, thereby significantly enhancing production efficiency at reduced efforts in adapting and developing fabrication processes and metrology steps compared to conventional approaches, which start from a hybrid orientation substrate involving SOI and bulk transistor architectures.

According to one illustrative embodiment of the present invention, a method comprises forming a first crystalline semiconductor layer having a first characteristic that represents at least one of a crystallographic orientation, a type of semiconductor material and an intrinsic strain thereof on a second crystalline semiconductor layer, wherein the second crystalline semiconductor layer has a second characteristic representing at least one of a crystallographic orientation, a type of semiconductor material and an intrinsic strain. Moreover, the first characteristic differs from the second characteristic. Additionally, an opening is formed in the first crystalline semiconductor layer to expose a portion of the second crystalline semiconductor layer and a crystalline semiconductor material is epitaxially grown in the opening while using the exposed portion of the second crystalline semiconductor layer as a growth template.

According to still another illustrative embodiment of the present invention, a substrate for forming transistor elements comprises a crystalline semiconductor layer and a first crystalline semiconductor region formed on the crystalline semiconductor layer and having a first characteristic that represents at least one of a crystallographic orientation, a type of semiconductor material and an intrinsic strain thereof. Moreover, the substrate comprises a second crystalline semiconductor region formed on the crystalline semiconductor layer and having a second characteristic, which differs from the first characteristic and represents at least one of a crystallographic orientation, a type of semiconductor material and an intrinsic strain thereof. Finally, the substrate comprises an isolation structure that laterally isolates the first and the second semiconductor regions.

In accordance with yet another illustrative embodiment of the present invention, a semiconductor device comprises a base substrate and a crystalline semiconductor layer formed on the base substrate. The semiconductor device further comprises a first crystalline semiconductor region formed on the crystalline semiconductor layer and having a first characteristic that represents at least one of a crystallographic orientation, a type of semiconductor material and an intrinsic strain thereof. Moreover, the semiconductor device comprises a second crystalline semiconductor region formed on the crystalline semiconductor layer and having a second characteristic that differs from the first characteristic and represents at least one of a crystallographic orientation, a type of semiconductor material and an intrinsic strain thereof. Moreover, an isolation structure laterally isolating the first and second semiconductor regions is provided. The device further comprises a first transistor element formed in and on the first crystalline semiconductor region and a second transistor element formed in and on the second crystalline semiconductor region.

BRIEF DESCRIPTION OF THE DRAWINGS

The invention may be understood by reference to the following description taken in conjunction with the accompanying drawings, in which like reference numerals identify like elements, and in which.

Figure 1:
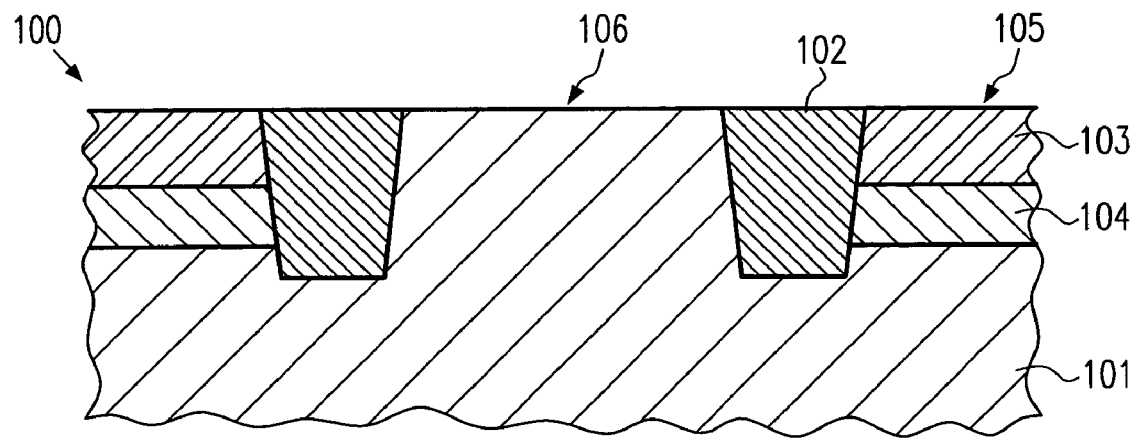
FIG. 1 schematically shows a cross-sectional view of a conventional hybrid orientation silicon substrate including SOI regions and bulk regions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the finding that the problems in manufacturing and metrology processes stemming from conventional hybrid orientation substrates may significantly be reduced in providing a substrate having semiconductor regions of different characteristics, which are formed on a crystalline semiconductor layer. In this way, the substrate provides a configuration as is typically encountered in bulk semiconductor devices, thereby significantly reducing efforts in adapting existing process technologies and metrology procedures and in the development of new fabrication techniques compared to conventional approaches requiring process and metrology techniques for both SOI devices and bulk devices. For this purpose, advanced wafer bond techniques may be used to first form a common substrate having two crystalline semiconductor regions of different characteristics, such as crystallographic orientation, that are in direct contact with each other. Based on this bulk-like substrate, an opening may be formed within the upper crystalline layer to expose a portion of the lower crystalline layer of desired size and shape. Thereafter, the exposed portion may be used as a "growth template" during an epitaxy process.

With reference to the accompanying drawings, further illustrative embodiments of the present invention will now be described in more detail. It should be appreciated that the present invention refers in particular embodiments to silicon-based substrates and semiconductor devices, as the vast majority of complex circuits are currently fabricated as CMOS circuitry on the basis of silicon and this development will continue in the near future due to significant cost advantages compared to other technologies. In particular, silicon-based substrates having a (110) and a (100) orientation are highly advantageous in forming CMOS devices, as the former orientation provides enhanced hole mobility, while the latter orientation exhibits superior electron mobility. Thus, specific embodiments of the present invention relate to silicon-based substrates having formed therein a semiconductor region with a (110) orientation and a (100) orientation. It should, however, be borne in mind that other semiconductor specific characteristics, such as the type of semiconductor material used and/or the intrinsic strain thereof, may also significantly affect the performance of circuit elements formed in such regions. For example, the formation of silicon/germanium semiconductor regions or silicon/carbon semiconductor regions on a silicon region or vice versa may result in a specified intrinsic strain, thereby also affecting the charge carrier mobility. In other cases, different semiconductor materials may be provided in a localized manner within a single substrate to adapt device characteristics in accordance with specific requirements. Consequently, the characteristics of a semiconductor material, when referred to in this application, should be seen in this broad view, unless in specific embodiments and in the claims it is explicitly referred to the crystallographic orientation.

Figure 2A:
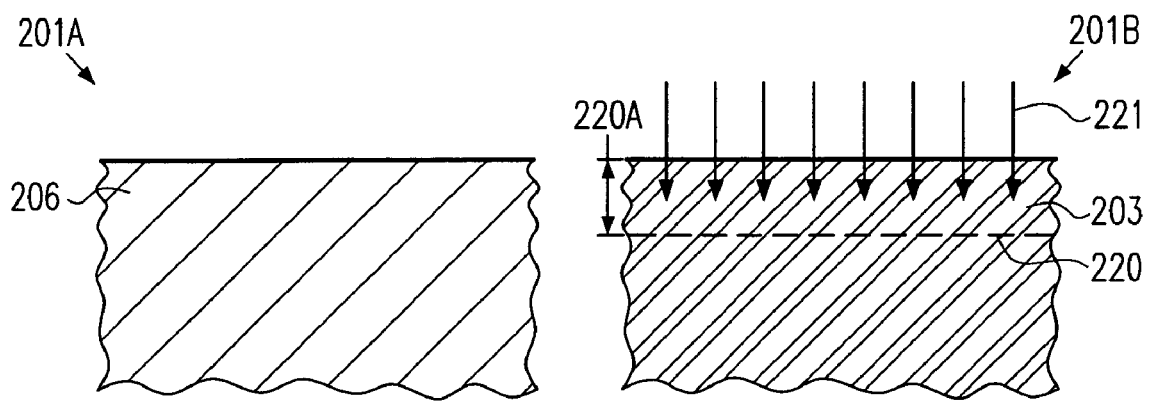
FIGS. 2a-2k schematically show cross-sectional views of a substrate and a semiconductor device during various manufacturing stages in accordance with illustrative embodiments of the present invention.

FIG. 2a schematically shows an initial stage for forming a hybrid substrate from a first substrate 201a and a second substrate 201b. The substrate 201a may represent a bulk semiconductor substrate or may represent any other appropriate substrate having formed thereon a crystalline semiconductor layer 206 having a thickness to endow the substrate 201a the "character" of a semiconductor bulk substrate. That is, the semiconductor layer 206 may have a thickness that is sufficient to receive a portion of trench isolation structures and provide electrical connection between neighboring circuit elements as is the case in conventional semiconductor devices formed on bulk substrates. In one illustrative embodiment, the substrate 201a may represent a silicon substrate having a (110) or a (100) orientation. Similarly, the substrate 201b may represent a semiconductor bulk substrate having a characteristic that differs from that of the substrate 201a. In other embodiments, the substrate 201b may represent any appropriate substrate having formed thereon a crystalline semiconductor layer 203 having desired characteristics. A thickness of the layer 203 is selected to at least correspond to a thickness of a semiconductor region in and on which transistor elements are to be formed. In one particular embodiment, the substrate 201b may represent a crystalline silicon substrate having a (100) or a (110) orientation, which differs from that of the substrate 201a.

In another illustrative embodiment, the substrate 201b may be exposed to an ion beam 221 to form a cleavage region 220 at a desired depth 220a, which may range from approximately 0.5-10 μm. In illustrative embodiments, the ion beam 221 may comprise hydrogen ions with a specified energy and an appropriate dose to deposit a desired concentration of ions at the cleavage region 220. Corresponding implantation parameters may readily be determined on the basis of simulation programs and/or test runs. For instance, with an implantation energy of approximately 10-50 keV at a dose of approximately $10^{16}$ ions/cm$^2$, a concentration of approximately $10^{19}$-$10^{20}$ atoms/cm$^3$ may be achieved for silicon within moderate implantation times. In other embodiments, helium ions or oxygen ions may be used to form the cleavage region 220. When using helium or oxygen, appropriate implantation parameters may also be determined on the basis of simulation and/or test runs.

Figure 2B:
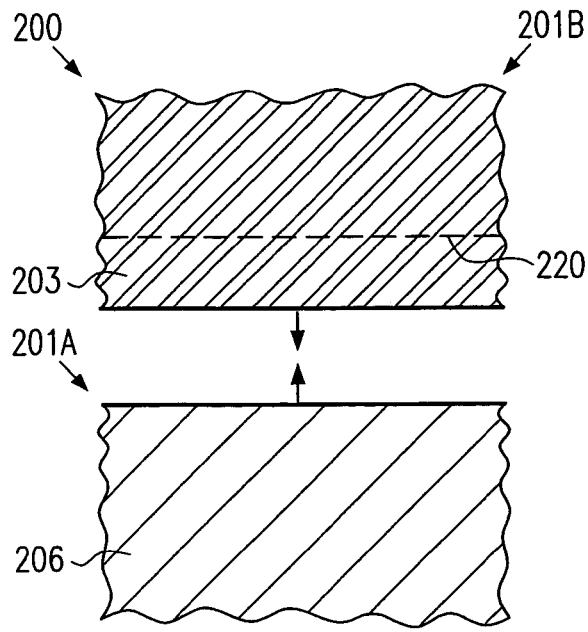

FIG. 2b schematically shows the substrates 201a, 201b while attaching both substrates to each other so that the crystalline semiconductor layers 206, 203 will come into direct contact with each other. After contacting the layers 206, 203, pressure and heat is exerted to the bonded structure to form bonds between the semiconductor material in the layer 206 and the semiconductor material in the layer 203. During annealing of the substrates 201a, 201b in the bonding process, the implanted ion species in the cleavage region 220 may diffuse and may agglomerate to form "bubbles," thereby starting a delamination process.

Figure 2C:
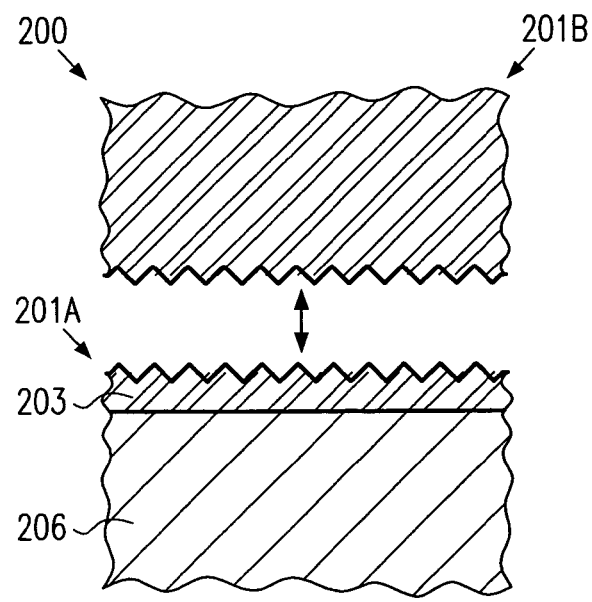

FIG. 2c schematically shows a substrate 200 resulting from the delamination process described above. Thus, the substrate 200 comprises the substrate 201a including the crystalline semiconductor layer 206 and the layer 203 formed thereon by the above-described bonding technique, whereas the remaining portion of the substrate 201b is removed. Thereafter, a chemical mechanical polishing (CMP) process may be performed to planarize a surface of the layer 203 and possibly remove excess material to adjust a final desired thickness of the layer 203.

Figure 2D:
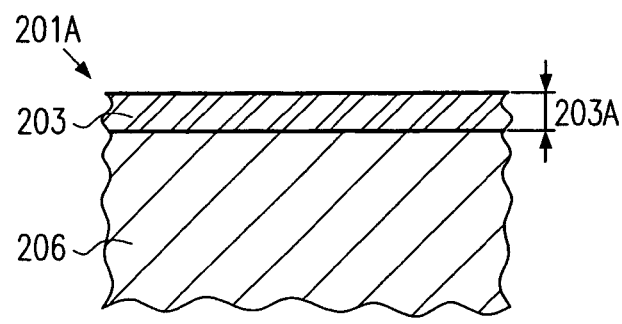

FIG. 2d schematically shows the substrate 200 comprising the substrate 201a with the semiconductor layer 206 and the layer 203, now having a final desired thickness 203a, in direct contact to each other. As previously noted, the semiconductor layer 206 may represent an upper portion of the substrate 201a when it is provided as a crystalline bulk substrate, or the semiconductor layer 206 may have a sufficient thickness to act as a "bulk substrate," when transistor elements are to be formed on and in the substrate 200, as will be described later on.

In other embodiments, the substrate 200 as shown in FIG. 2d may be formed by bonding the substrates 201a, 201b without performing the ion implantation 221, wherein, after the bonding process, the substrate 201b may be thinned by well-established etching and/or grinding and polishing techniques. A corresponding process may be advantageous when the initial substrate 201b may be provided in a moderately thin form, or when implantation-induced damage at the surface of the layer 203 (FIG. 2a) may be considered disadvantageous for the further processing of the substrate 200. In still other embodiments, the substrates 201a, 201b may be bonded and the ion implantation 221 may be performed thereafter to form the cleavage region 220, thereby substantially avoiding implantation-induced damage in the layer 203. The implantation process 221 may be preceded by an etch and/or grinding and polishing process to remove excess material of the substrate 201b, thereby relaxing the constraints for the subsequent ion implantation 221 as the penetration depth of the implant species is reduced.

As a result, the substrate 200 represents a bulk substrate with the layer 203 for forming circuit elements therein, while at least the layer 206 provides the "bulk" behavior of the substrate 200 and also represents a "template" for forming a semiconductor region within the layer 203 that has substantially the same characteristics as the layer 206, as will be described with reference to FIGS. 2a-2k.

Figure 2E:
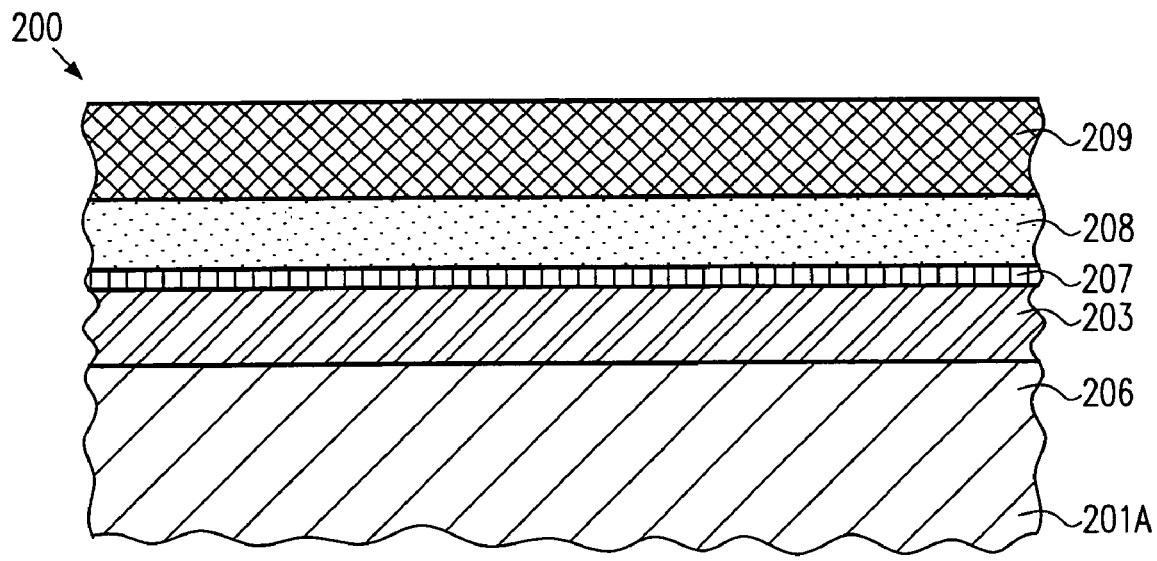

FIG. 2e schematically shows the substrate 200 in a further advanced manufacturing stage. A dielectric layer stack that is to be patterned into an etch mask is formed on the layer 203 and may, in one embodiment, comprise a first layer 207, for instance provided as a silicon dioxide layer having a thickness in the range of approximately 3-10 nm. Moreover, an etch stop layer 208 may be formed on the layer 207, for instance with a thickness in the range of approximately 30-50 nm, followed by a mask layer 209 formed of a material that exhibits a significant etch selectivity with respect to the etch stop layer 208. For example, the etch stop layer 208 may be comprised of silicon nitride, while the mask layer may be comprised of silicon dioxide. A thickness of the mask layer, when provided in the form of silicon dioxide, may range from approximately 100-200 nm. The layers 207, 208, 209 may be fabricated by well-established process techniques, wherein the layer 207 may, for instance, be deposited by plasma enhanced chemical vapor deposition (PECVD0 or may be formed by oxidizing a surface portion of the layer 203. The layers 208, 209 may also be formed by well-established PECVD techniques.

Figure 2F:
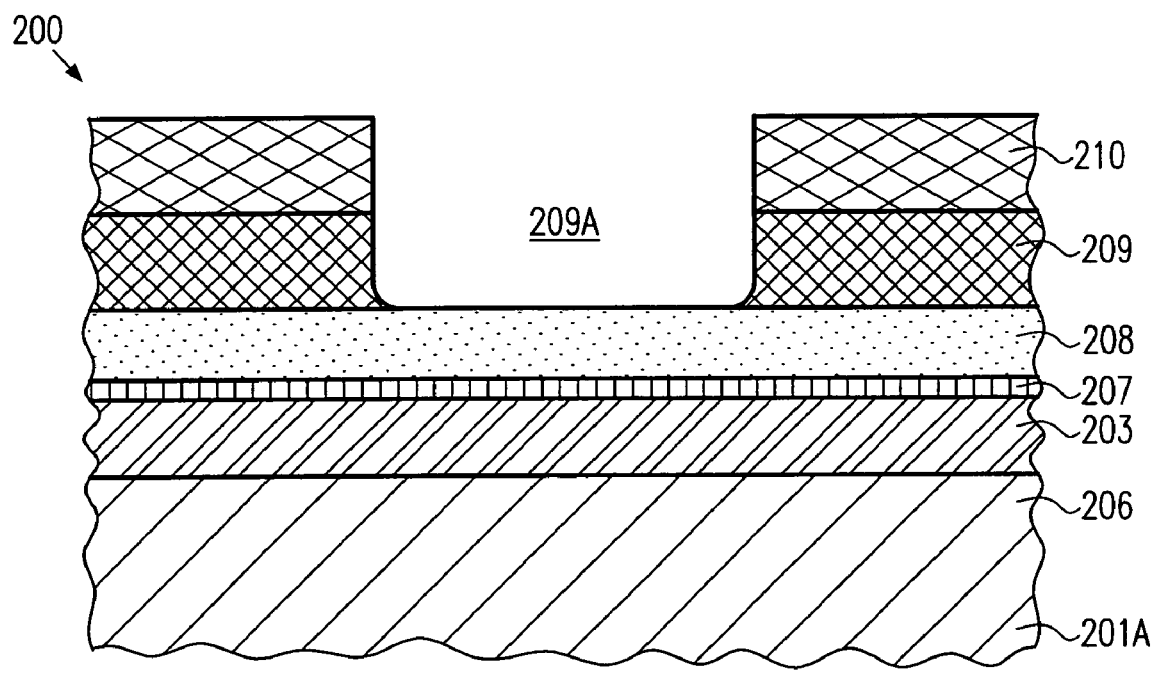

FIG. 2f schematically shows the substrate 200 with a patterned resist layer 210 and an opening 209a formed in the mask layer 209. The resist layer 210 may be formed by well-established photolithography techniques including the deposition, pre-exposure treating of the resist layer 210, the exposure thereof and the subsequent development. Thereafter, the mask layer 209 may be patterned to form the opening 209a on the basis of an appropriately designed etch procedure. For instance, an etch process on the basis of hydrofluoric acid (HF) may be performed, when the mask layer 209 is comprised of silicon dioxide, so that the etch process may reliably be stopped in and on the etch stop layer 208, which may be comprised of silicon nitride. Thereafter, the resist layer 210 may be removed by well-known techniques.

Figure 2G:
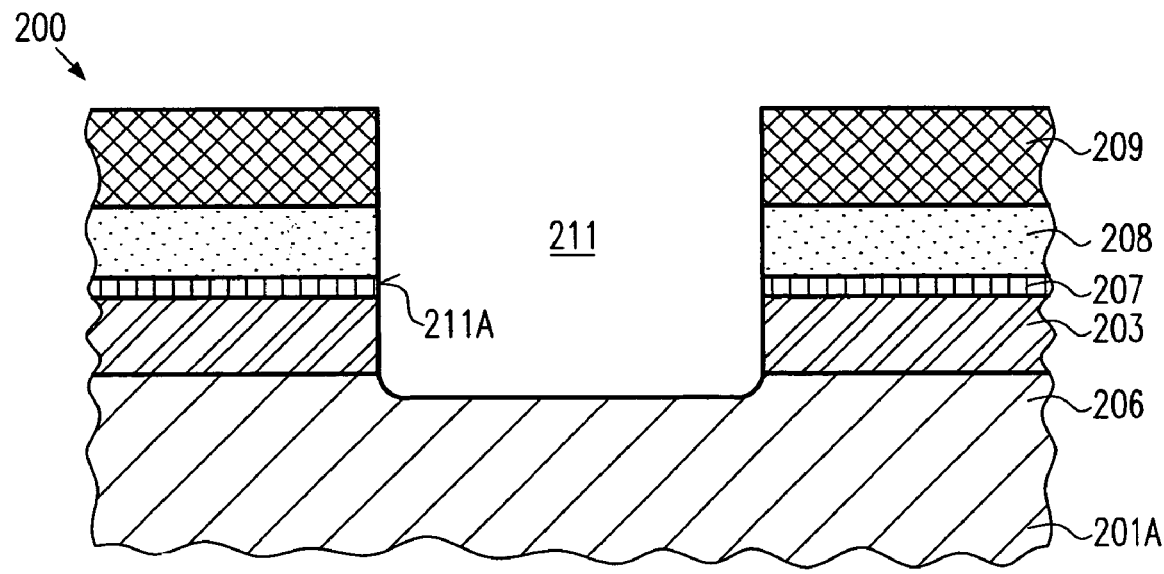

FIG. 2g schematically shows the substrate 200 during an anisotropic etch process 223 to form an opening 211 through the layers 208, 207, 203 and into the layer 206. During the etch process 223, which may include different etch chemistries, depending on the material composition of the layers 208, 207, 203 and 206, the layer 209 acts as an etch mask. For the well-known materials such as silicon nitride and silicon, appropriate etch recipes of the process 223 are well established, or appropriate recipes may readily be established on the basis of well-known processes by experiment. Thereafter, in some embodiments, the residues of the mask layer 209 and possibly the etch stop layer 208 may be removed by correspondingly designed etch procedures. In other embodiments, a thin oxide liner, acting as an etch stop layer in a subsequent anisotropic etch process, may be formed on the residue of the mask layer 209 and within the opening 211. In still other embodiments, the further processing may be performed on the basis of the structure as shown in FIG. 2g. That is, a spacer layer may conformally be deposited, for instance in the form of a silicon nitride layer, to cover horizontal portions of the substrate 200 and in particular sidewalls 211a of the opening 211. Thereafter, a further anisotropic etch process may be performed to remove the material of the spacer layer from the horizontal portions while leaving at least lower portions of the sidewalls 211a covered by the spacer material. Corresponding process techniques are well established, for instance for the formation of sidewall spacers of transistor elements. Consequently, appropriate process recipes may readily be adapted or used.

In a further illustrative embodiment (not shown), the mask layer 209 may be omitted and the layers 207 and 208 may be used for directly patterning the resist mask 210 thereon. Thereafter, the opening 211 may be formed by a dry etch process through the layers 208, 207 and 203 into the layer 206.

Figure 2H:
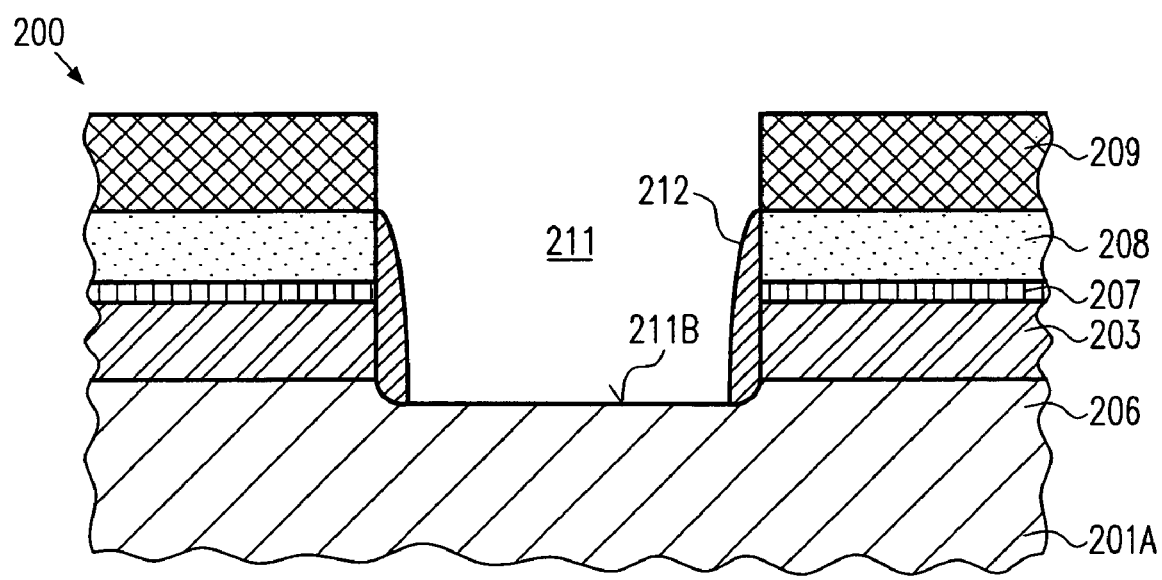

FIG. 2h schematically shows the substrate 200 after the completion of the above-described spacer formation process. Thus, the substrate 200 comprises sidewall spacers 212, for instance formed of silicon nitride, having a height to at least cover exposed portions of the semiconductor layer 203. The height of the sidewall spacers 212 may be controlled by the duration of the anisotropic etch process. Thereafter, the substrate 200 may be cleaned to remove any oxide portions or contaminations formed on a bottom 211b of the opening 211. For example, an oxide liner may have formed (not shown) prior to the deposition of the spacer material, which may have acted as an etch stop layer so as to not unduly create crystal damage in the layer 206. During this pre-clean process, the mask layer 209 may also be removed, thereby exposing the layer 208. For instance, when the mask layer 209 is comprised of silicon dioxide, hydrofluoric acid (HF) may be used in removing the layer 209 and any oxidized portions at the bottom 211b of the opening 211, substantially without affecting the sidewall spacers 212 and the layer 208 due to the high etch selectivity between silicon dioxide and silicon nitride on the basis of HF. After completion of the pre-cleaning process, the substrate 200 may be subjected to an epitaxial growth process to form semiconductor material within the opening 211, while using the bottom surface 211b as a template for obtaining a crystalline structure that is correlated to that of the layer 206.

Figure 2I:
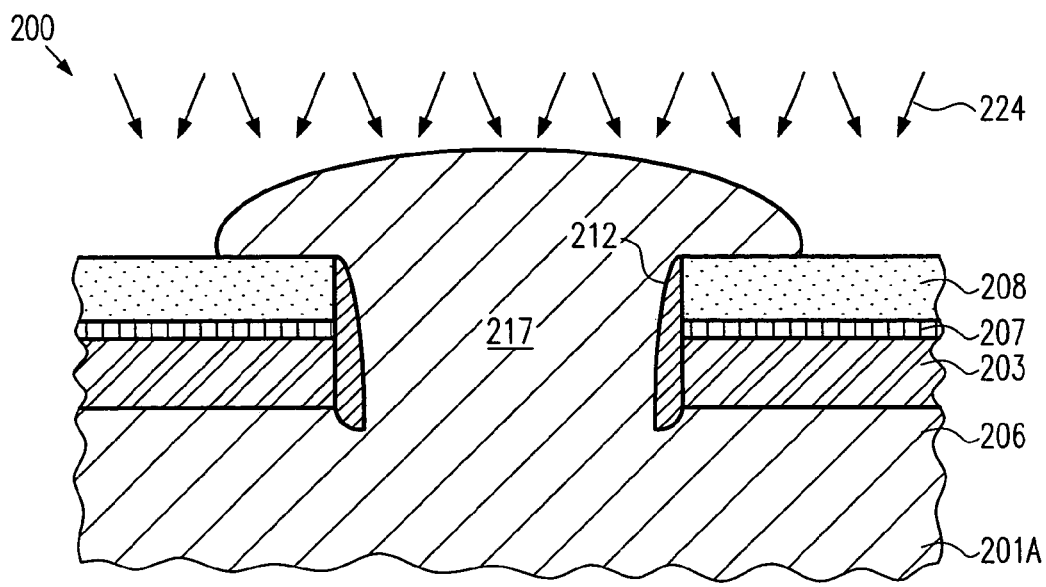

FIG. 2i schematically shows the substrate 200 subjected to an epitaxial growth process 224 to form a crystalline semiconductor region 217 within the opening 211, wherein the semiconductor region 217 differs in at least one characteristic from the semiconductor layer 203, due to the fact that the crystalline layers 206, 203 differ in at least one characteristic. In particular embodiments, the semiconductor region 217 differs in crystallographic orientation from the semiconductor layer 203. In other embodiments, the semiconductor material of the region 217 may differ from that of the layer 206, thereby creating a specified internal strain within the region 217 due to a mismatch of the crystal lattice, while the overall lattice orientation is substantially maintained. For example, the layer 206 may be comprised of a silicon/germanium or silicon/carbon mixture, while the semiconductor region 217 is substantially comprised of silicon. In this case, the silicon in the region 217 may grow with a certain amount of inherent compressive or tensile strain. In other embodiments, the material in the region 217 may be comprised of a silicon/germanium or a silicon/carbon mixture, while the underlying crystalline layer 206 is comprised of silicon of a specified orientation. Also in this case, the region 217 may be formed with a specific amount of internal compressive or tensile strain due to the slight lattice mismatch of the layer 206 and the material in the region 217.

In a further illustrative embodiment (not shown), the epitaxial growth 224 may be stopped at a height corresponding to the layer 207 or 208. Subsequently, the surface of the semiconductor material 217 within the opening may be oxidized by a thermal process to adjust the height of the material 217 within the opening 211 to the surface of the layer 203. Since the oxidation rate of the material may be well known in advance, the portion of the material 217 consumed by this process may be finely tuned to achieve the desired height. Thereafter, the layer 208 may be removed, for instance, by a selective etching and/or chemical mechanical polishing. Next, the layer 207, when provided as an oxide layer, and the thermal oxide of the material 217 may be removed by wet etch on the basis of HF.

After the completion of the epitaxial growth process 224, any excess material formed on portions of the layer 208 may be removed, thereby also planarizing the resulting structure. Thus, the substrate 200 comprises different crystalline semiconductor regions, that is the layer 203 and the region 217, which are laterally separated by the sidewall spacers 212, while the layer 206 provides the "bulk" characteristics of a semiconductor substrate used for forming "bulk" semiconductor devices.

Figure 2J:
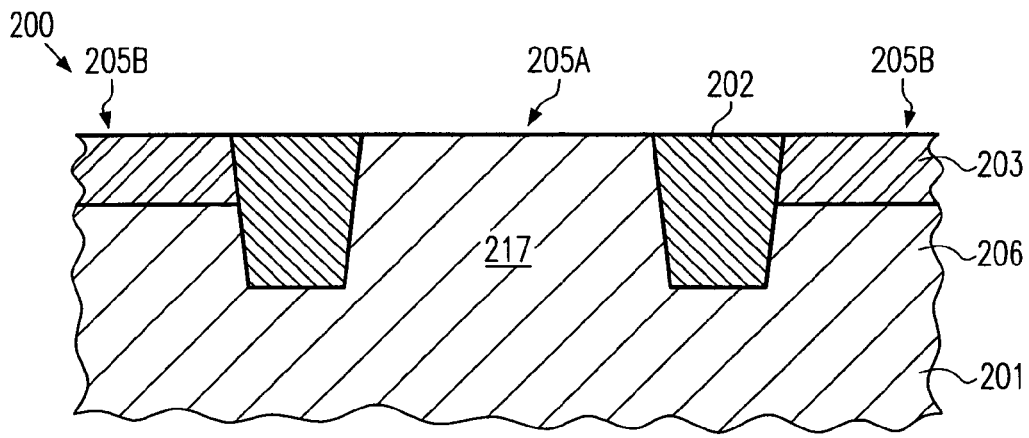

FIG. 2j schematically shows the substrate 200 in a further advanced manufacturing stage, wherein the residues of the layer 208, that is the portion of the layer 208 that has not been removed by the preceding chemical mechanical polishing process, and the layer 207 are removed. Moreover, isolation structures 202 are formed at positions where the sidewall spacers 212 are located, so that the isolation structures 202, which may be provided in the form of shallow trench isolations, define a region 205a including the semiconductor region 217, which is formed on a portion of the layer 206. The region 205a is laterally separated from a region 205b including portions of the layer 203, which is formed on a portion of the layer 206, wherein both types of regions 205a, 205b represent crystalline semiconductor regions meeting the criteria of a substrate for forming "bulk" devices, as both regions 205a, 205b are formed on a common crystalline layer 206, which in particular embodiments may represent the upper portion of the substrate 201a when provided in the form of a crystalline bulk substrate.

Figure 2K:
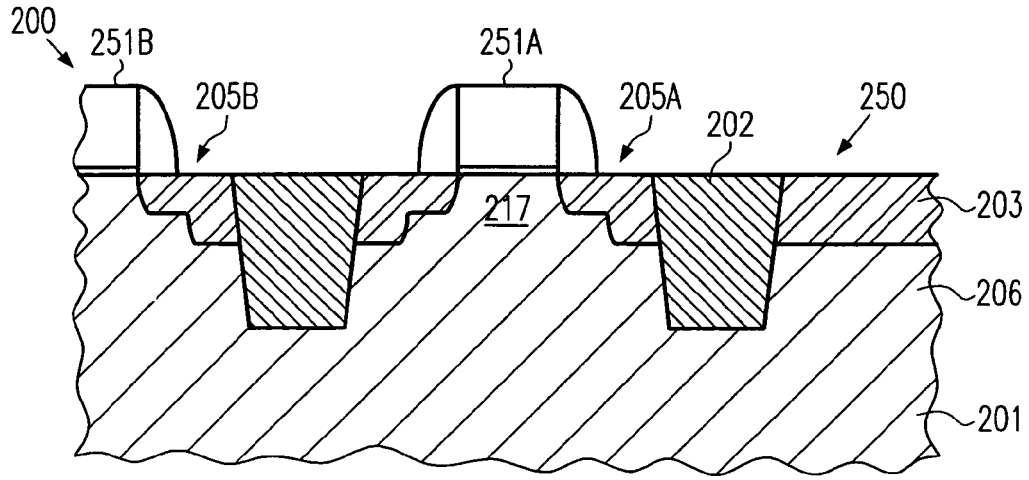

FIG. 2k schematically shows a semiconductor device 250 comprising the substrate 200 as shown in FIG. 2j. The semiconductor device 250 may comprise a first transistor element 251a formed in and on the first region 205a and a second transistor element 251b formed in and on the second region 205b. As previously explained, the transistor elements 251a, 251b may be formed on the basis of a manufacturing and, metrology strategy according to criteria that are related to semiconductor bulk substrates, thereby providing the potential for using or developing process and metrology strategies commonly for both types of transistors 215a, 215b, without distinguishing between SOI strategies and bulk device strategies, as is the case in the conventional approaches. For example, the region 205a may in particular embodiments represent a silicon region having a (110) or a (100) orientation so that the first transistor element 251a may represent a P-channel transistor or an N-channel transistor, respectively, to thereby enhance the performance thereof due to the increased hole mobility or electron mobility, respectively. Similarly, the region 205b may represent a silicon region having a (100) or a (110) orientation, that is, an orientation differing from that of the region 105a, so that preferably the transistor element 251b may represent an N-channel transistor or a P-channel transistor, respectively. In other embodiments, the regions 205a, 205b may differ, in addition or alternatively, from each other by other characteristics such as the type of semiconductor material and/or the intrinsic strain in the regions 205a, 205b.

Moreover, the regions 205a and 205b, although shown to correspond to transistor active regions, may in other embodiments represent increased areas within a die region of the substrate 200, or may even represent an extended area of the substrate 200 including a plurality of die regions. In this way, device performance may be adapted in a more "global" fashion across the substrate 200 to impart specific "substrate characteristics" to desired substrate areas or die areas.

As a result, the present invention provides a technique that enables the formation of "bulk-like" substrates including crystalline semiconductor regions of different characteristics, in particular of different crystallographic orientations, thereby allowing the formation of semiconductor devices based on a single transistor architecture. In this way, existing process techniques and metrology methods and also future developments for process techniques and metrology methods to be used in highly advanced semiconductor devices requiring semiconductor regions of different characteristics may significantly be facilitated compared to conventional approaches. Hereby, advanced wafer bond techniques may advantageously be used to form two semiconductor layers of different characteristics in direct contact with each other, which may then be further processed to obtain the required bulk semiconductor substrate of different crystallographic characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first crystalline semiconductor layer having a first intrinsic strain characteristic of a first type on and in contact with a second crystalline semiconductor layer having a second intrinsic strain characteristic of a second type differing from said first type, wherein the first and second types each comprise a different one of a compressive type, a tensile type, and a substantially unstrained type;
    forming an opening in said first crystalline semiconductor layer to expose a portion of said second crystalline semiconductor layer; and
    epitaxially growing a crystalline semiconductor material in said opening while using said exposed portion of said second crystalline semiconductor layer as a growth template, wherein at least one of said second crystalline semiconductor layer and said epitaxially grown crystalline semiconductor material includes a dopant ion creating a lattice mismatch between said second crystalline semiconductor layer and said epitaxially grown crystalline semiconductor material to induce strain into said epitaxially grown crystalline semiconductor material.

2. The method of claim 1, wherein said epitaxially grown crystalline semiconductor material comprises said second intrinsic strain characteristic.

3. The method of claim 1, wherein forming said first crystalline semiconductor layer comprises bonding a first substrate having formed thereon said first crystalline semiconductor layer to a second substrate having formed thereon said second crystalline semiconductor layer.

4. The method of claim 3, further comprising forming a cleavage region in said first substrate by ion implantation.

5. The method of claim 4, further comprising removing a first portion of said first substrate by means of said cleavage region so as to keep attached a second portion of said first substrate to said second substrate, said second portion including said first crystalline semiconductor layer.

6. The method of claim 5, further comprising polishing said second portion to expose said first crystalline semiconductor layer.

7. The method of claim 1, wherein forming said opening comprises forming a hard mask on said first crystalline semiconductor layer with a size and shape corresponding to said opening and selectively etching said first crystalline semiconductor layer using said hard mask.

8. The method of claim 7, wherein forming said hard mask comprises forming an etch stop layer above said first crystalline semiconductor layer, forming a mask layer on said etch stop layer, forming a resist mask on said mask layer and etching said mask layer using said resist mask.

9. The method of claim 1, further comprising forming sidewall spacers on sidewalls of said opening to cover exposed portions of said first crystalline semiconductor layer.

10. The method of claim 1, further comprising forming a trench isolation enclosing said semiconductor material selectively grown in said opening.

11. The method of claim 10, further comprising forming a first transistor in and on said first crystalline layer and forming a second transistor in and on said semiconductor material selectively grown in said opening.

12. The method of claim 1, wherein said dopant ion comprises carbon.

13. The method of claim 1, wherein said dopant ion comprises germanium.

* * * * *